(12) United States Patent
Ha

(10) Patent No.: US 8,513,865 B2
(45) Date of Patent: Aug. 20, 2013

(54) LED LIGHTING ASSEMBLY

(75) Inventor: Jong-Soo Ha, Shenzhen (CN)

(73) Assignees: AAC Acoustic Technologies (Shenzhen) Co., Ltd., Shenzhen (CN); American Audio Components Inc., La Verne, CA (US)

( * ) Notice: Subject to any disclaimer, the term of this patent is extended or adjusted under 35 U.S.C. 154(b) by 0 days.

(21) Appl. No.: 13/190,145

(22) Filed: Jul. 25, 2011

(65) Prior Publication Data

US 2012/0112617 A1 May 10, 2012

(30) Foreign Application Priority Data

Nov. 10, 2010 (CN) .......................... 2010 1 0538704

(51) Int. Cl.
*H01J 1/02* (2006.01)
(52) U.S. Cl.
USPC ............. 313/46; 362/294; 362/310; 362/373

(58) Field of Classification Search
USPC ........................... 313/46; 362/294, 310, 373
See application file for complete search history.

(56) References Cited

U.S. PATENT DOCUMENTS

2007/0086211 A1* 4/2007 Beeson et al. ................ 362/628
2012/0002420 A1* 1/2012 Imai et al. ................ 362/249.02

FOREIGN PATENT DOCUMENTS

JP 2009054860 A * 3/2009

* cited by examiner

*Primary Examiner* — Mary Ellen Bowman
(74) *Attorney, Agent, or Firm* — Anova Law Group, PLLC

(57) ABSTRACT

A LED lighting assembly includes a substrate defining a body and a central hole surrounded by the body, a conductive mass positioned in the central hole of the substrate, a LED chip defining a bottom attached to the conductive mass, and a shell mounted on the body and forming a room together with the body.

6 Claims, 3 Drawing Sheets

LED LIGHTING ASSEMBLY

FIELD OF THE INVENTION

The present disclosure generally relates to the art of LED lightings, more particularly to a LED lighting assembly with heat dissipating means.

RELATED ART OF THE INVENTION

A LED lighting assembly is a type of solid-state lighting that can utilize light-emitting diodes (LEDs) as a light source. LEDs convert electricity to light via current through a junction region comprising two different semiconductors, by which electrons and holes coupled at the junction region and generate light. LED's advantages of resistance to impact and nearly limitless lifetime under certain conditions make an LED lamp a cost-effective yet high quality replacement for incandescent and fluorescent lamps.

But, when LEDs emit light, LEDs generate a great deal of heat. Therefore, after a long time, the temperature of LEDs can be much higher. So that, the performance of the LEDs will be lower, and, the lifetime of the LEDs will be reduced.

Therefore, an improved LED lighting assembly that can resolve the problems mentioned-above is desired.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments.

DETAILED DESCRIPTION OF THE EXEMPLARY EMBODIMENTS

Figure 1:
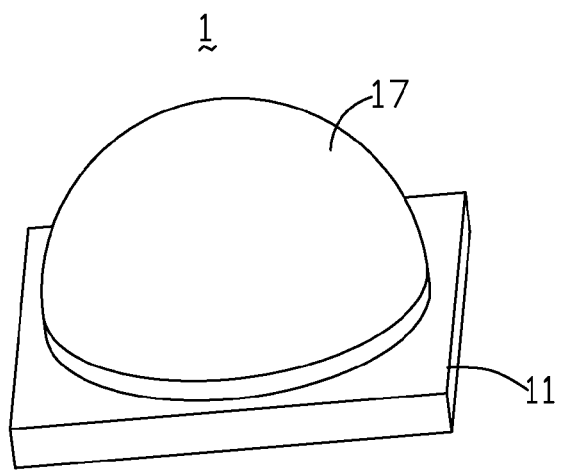
FIG. 1 depicts an isometric assembled view of a LED lighting assembly in accordance with one exemplary embodiment of the present invention.
Figure 2:
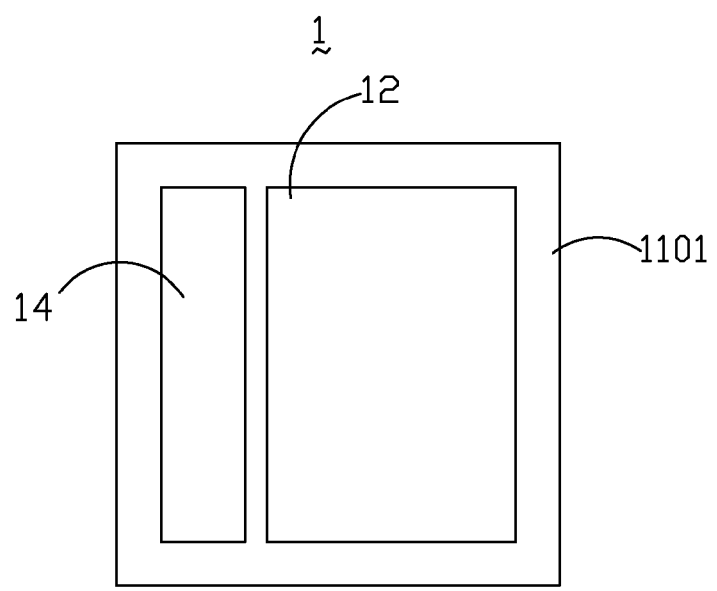
FIG. 2 depicts a front view of a bottom of the LED lighting assembly in FIG. 1.

Embodiments of the present disclosure will now be described in detail below, with reference to the accompanying drawings.

Referring to FIGS. 1-4, a LED lighting assembly 1, according to one exemplary embodiment of the present invention, includes a substrate 11 defining a body 110 and a central hole 111 surrounded by the body 110, a conductive mass 15 positioned in the central hole 111, a LED chip 13 connected with the conductive mass 15, a shell 17 mounted on the substrate 11 for forming a room 100 where the LED chip 13 is positioned.

The substrate 11 is made of ceramic material. The body 110 of the substrate 11 defines an upper surface 1100, and a lower surface 1101 opposite to the upper surface 1100. In the embodiment, an outline of the substrate 11 is a square. It is to be understood, in other embodiments, the outline of the substrate 11 can be a circle or other shape.

The conductive mass 15 is made of metal with lower resistivity and higher thermal conductivity.

The conductive mass 15 defines an upper surface 150 close to the upper surface 1100 of the substrate 11, a lower surface 151 opposite to the upper surface and a sidewall 152 connecting the upper surface 150 with the lower surface 151.

An outline of the conductive mass 15 is corresponded to a shape of the central hole 111. And, the sidewall 152 of the conductive mass 15 is connected tightly to an inner side of the central hole 111 of the substrate 11, for transferring the heat of the conductive mass to the substrate.

The LED chip 13, for converting electricity to light, defines a bottom 130, a top 131 opposite to the bottom 130 and a side 132 connected the bottom 130 with the top 131.

The bottom 130 of the LED chip 13 is attached to the upper surface 150 of the conductive mass 15. Further, an area of the upper surface 150 of the conductive mass 15 is bigger than or equal to the bottom 130 of the LED chip, so that, the whole area of the bottom 150 of the LED chip is completely attached to the upper surface 150 of the conductive mass 15. When the LED chip works and produces heat, the heat can be transferred to the conductive mass 15. Therefore, the temperature of the LED chip is dropped, and the performance of the LED chip can be improved.

The LED chip has a first electrode and a second electrode for receiving electrical signal. And a first terminal 12 and a second terminal 14 are provide on the lower surface 1101 of the body 110 for being electrically connected with external circuit so as to provide electrical signal to the first and second electrode.

In the embodiment, the first electrode is electrically connected with the conductive mass 15. In addition, the first electrode is positioned between the bottom 130 of the LED chip and the upper surface 150 of the conductive mass 15. So, the first electrode is directly attached to the upper surface 150 of the conductive mass 15. And the lower surface 151 of the conductive mass 15 is directly attached to the first terminal 12 for being electrically connected with the first terminal 12. Furthermore, an area of the first terminal 12 is not smaller than an area of the lower surface 151 of the conductive mass 15, so that, the heat of the conductive mass 15 can easily be transferred to the first terminal 12.

Figure 3:
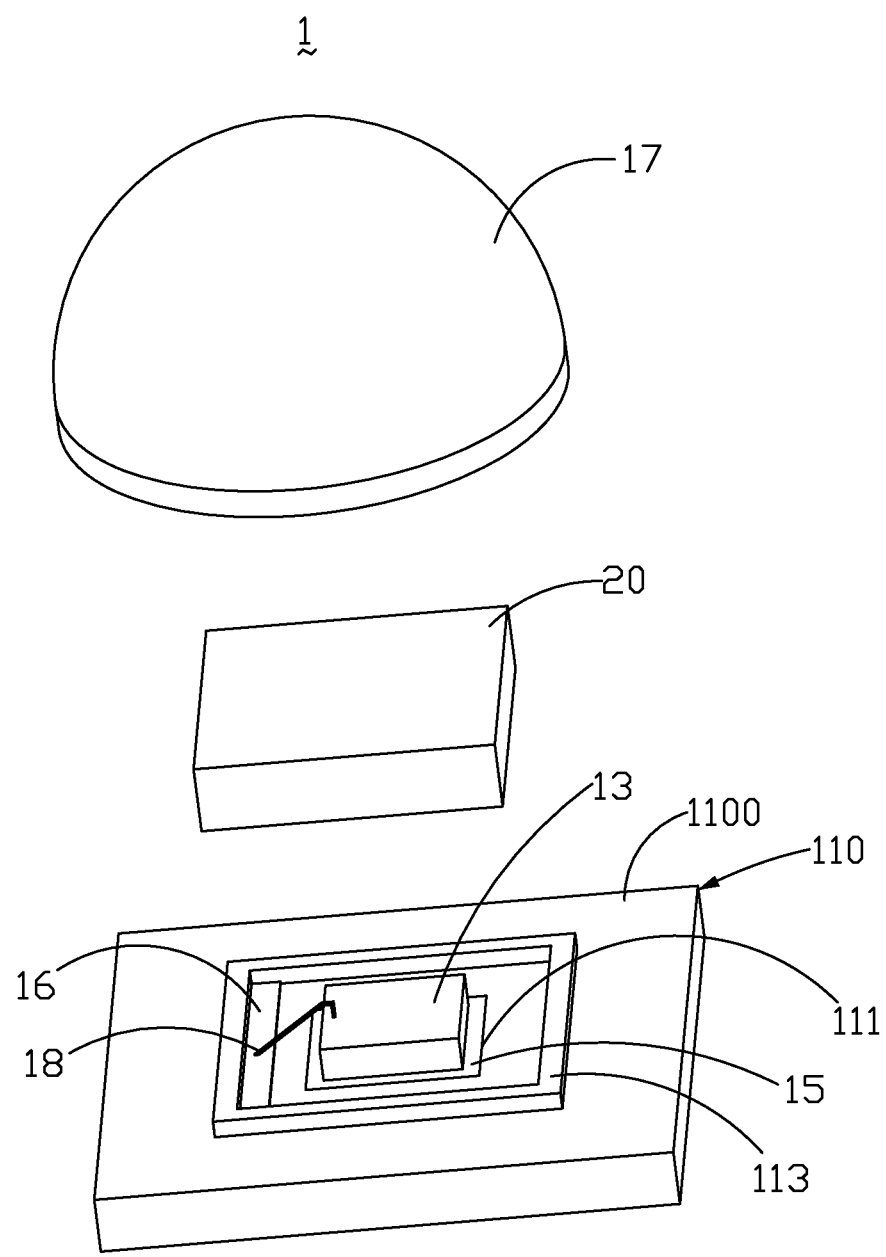
FIG. 3 depicts an isometric exploded view of the LED lighting assembly in FIG. 1.
Figure 4:
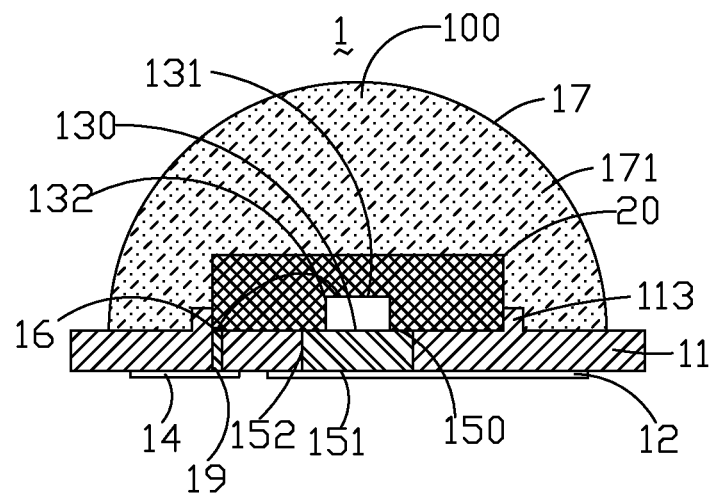
FIG. 4 depicts a cross-sectional view of the LED lighting assembly in FIG. 1.

The second electrode is defined for being electrically connected with the second terminal 14. Referring to FIGS. 3-4, a pad 16 is provided on the upper surface 1100 of the body 110, and a wire 18 is provided for being connected with the second electrode and the pad 16. And, a hole 19 passing the upper surface 1100 and the lower surface 1101 of the body is provided, and filled with conductive material so that the pad 16 is electrically connected with the second terminal 14 by said conductive material in the hole 19.

In the embodiment, in order to protect the LED chip 13, a phosphor coat 20 is provided for covering the top 131 and side 132 of the LED chip 13, in other words, convering an outer surface but not including the bottom.

Figure 5:
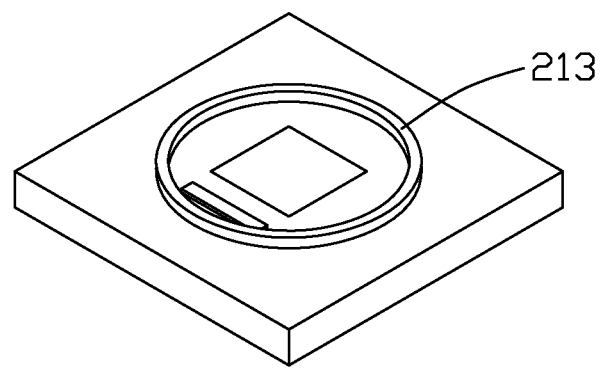
FIG. 5 depicts an isometric view of a substrate in accordance with another exemplary embodiment of the present invention.

In order to limit the position of the phosphor coating 20, a barrier 113 projecting from the upper surface 1100 of the body 110 is provided. An outline of the barrier 113 corresponds with an outline of the phosphor coating 20. In the embodiment, the outline of the phosphor coating 20 is a square, and, the barrier 113 is a square frame for surrounding the whole edge of the phosphor coating. It is to be understood, in another embodiment, the outline of the phosphor coating can be not limited, and can be a circle. Accordingly, the barrier 213 is an annulus, referring to FIG. 5.

The barrier 113 can be manufactured together with the substrate 11, or can be manufactured separately.

The shell 17 is made of silicone lens and an approximately half sphere. The shell 17 is mounted on the upper surface 1100 of the body 110 of the substrate 11 for forming the room 100 together with the upper surface 1100 of the body 110. The LED chip 13 and the phosphor coat 20 are received in the room 100. The room 100 is filled with inert gas 171.

While the present invention has been described with reference to specific embodiments, the description of the invention is illustrative and is not to be construed as limiting the invention. Various of modifications to the present invention can be made to the exemplary embodiments by those skilled in the art without departing from the true spirit and scope of the invention as defined by the appended claims.

What is claimed is:

1. A LED lighting assembly, comprising:
    a substrate defining a body and a central hole surrounded by the body, the body defining an upper surface and a lower surface opposite to the upper surface;
    a thermal conductive mass positioned in the central hole of the substrate and defining an upper surface close to the upper surface of the body of the substrate and a lower surface opposite to the upper surface;
    a LED chip defining a bottom attached to the upper surface of the thermal conductive mass;
    a shell mounted on the upper surface of the body of the substrate and forming a room together with the body;
    a phosphor coating covering an outer surface but not including the bottom of the LED chip;
    a barrier surrounding and connected to a whole peripheral side of the phosphor coating for limiting the position of the phosphor coating;
    a first electrode electrically connected to the conductive mass and a second electrode;
    a first terminal electrically connected to the conductive mass and a second terminal electrically connected to the second electrode; wherein
    the outline of the phosphor coating is square, the barrier is a square frame;
    a pad is provided on the upper surface of the body to connect the second electrode to the second terminal, and the pad is disposed within the barrier and touches an inner wall of the barrier.

2. The LED lighting assembly as described in claim 1, wherein an area of the upper surface of the conductive mass is not smaller than an area of the bottom of the LED chip, and the whole area of the bottom of the LED chip is completely attached to the upper surface of the conductive mass.

3. The LED lighting assembly as described in claim 1, wherein the room is filled with inert gas.

4. The LED lighting assembly as described in claim 1, wherein the first and second terminals are attached to the lower surface of the body of the substrate.

5. The LED lighting assembly as described in claim 4, wherein the lower surface of the conductive mass is directly attached to the first terminal.

6. The LED lighting assembly as described in claim 5, wherein an area of the first terminal is not smaller than an area of the lower surface of the conductive mass.

* * * * *